(12) United States Patent
Lee

(10) Patent No.: US 7,635,213 B2
(45) Date of Patent: Dec. 22, 2009

(54) VEHICLE LIGHT ASSEMBLY

(76) Inventor: Ching-Liang Lee, 4F., No. 4, Alley 2, Lane 222, Liancheng Rd., Jhonghe City, Taipei County 235 (TW)

( * ) Notice: Subject to any disclaimer, the term of this patent is extended or adjusted under 35 U.S.C. 154(b) by 0 days.

(21) Appl. No.: 12/068,470

(22) Filed: Feb. 7, 2008

(65) Prior Publication Data

US 2009/0201695 A1 Aug. 13, 2009

(51) Int. Cl.
*F21V 33/00* (2006.01)
(52) U.S. Cl. ........................ 362/545; 362/800
(58) Field of Classification Search ............. 362/543, 362/544, 545, 555, 612, 800
See application file for complete search history.

(56) References Cited

U.S. PATENT DOCUMENTS

| | | | |
|---|---|---|---|
| 6,499,870 B1 * | 12/2002 | Zwick et al. ............... | 362/505 |
| 6,520,666 B1 * | 2/2003 | Beyerlein et al. .......... | 362/471 |
| 6,929,390 B2 * | 8/2005 | Amano ...................... | 362/545 |
| 6,948,838 B2 * | 9/2005 | Kunstler .................... | 362/545 |
| 7,192,171 B2 * | 3/2007 | Rodriguez Barros et al. ............... | 362/494 |
| 7,325,955 B2 * | 2/2008 | Lucas et al. ................. | 362/545 |
| 2002/0067621 A1* | 6/2002 | Kugler et al. ............... | 362/543 |
| 2003/0076690 A1* | 4/2003 | Takahashi ................... | 362/545 |

* cited by examiner

*Primary Examiner*—Laura Tso

(57) ABSTRACT

A vehicle light assembly includes a casing with a plurality of frames connected thereto and each frame has a hole for receiving a light bulb of a Light Emitting Diode therein. Each Light Emitting Diode includes two legs and two protrusions extend from the two legs respectively. The legs of the Light Emitting Diodes are connected to a circuit board by a section from a distill end of each leg to the protrusion. The light bulbs are then bent toward a side of the circuit board and engaged with the holes of the frames. The side of the circuit board is shaped to cooperate with the positions of the frames.

7 Claims, 6 Drawing Sheets

VEHICLE LIGHT ASSEMBLY

FIELD OF THE INVENTION

The present invention relates to a vehicle light assembly and more particularly, to an arrangement between the Light Emitting Diodes, the circuit board and the light casing.

BACKGROUND OF THE INVENTION

A conventional vehicle light assembly is shown in FIGS. 1 and 2, and generally includes a casing 1 with a plurality of frames 11 located therein and each frame 11 has a hole 111 for receiving a Light Emitting Diode 12 therein. The locations of the frames 11 are arranged to be not located on the same flat plane so as to from a desired outer contour.

In order to be cooperated with the frames 11 that are not located on the same flat plane, the Light Emitting Diodes 12 are inserted to the circuit 13 and then the circuit and the Light Emitting Diodes 12 are then sent to a soldering machine to solder the Light Emitting Diodes 12 on the circuit board 13. The Light Emitting Diodes 12 are then inserted into the holes 111 of the frames 11. However, the Light Emitting Diodes 12 are fixed on the circuit board 13 so that the Light Emitting Diodes 12 might not be located at a desired height relative to the frames 11. When assembling the frames 11 and the Light Emitting Diodes 12, some Light Emitting Diodes 12 are located at the desired positions and some are not. This results in many dis-satisfaction semi-products.

As shown in FIG. 3, in order to control the lengths that the legs 121 of the Light Emitting Diodes 12 are connected to the circuit board 13, some developers add a support member 14 between the circuit board 13 and the Light Emitting Diodes 12. Nevertheless, the support members 14 require a lot of extra labor efforts and cost.

FIG. 4 shows that some developers narrow the hole 111 of the frame 11 and the inner diameter of the hole 111 is slightly smaller than the Light Emitting Diode 12 so that the Light Emitting Diodes 12 can be inserted into the holes 111 before being soldered with the circuit board 13. Due to the smaller holes 111, the assemblers have to take longer time to insert the Light Emitting Diodes 12 into the holes 111. Besides, when the Light Emitting Diodes 12 are positioned on the frames 11, the legs 121 of the Light Emitting Diodes 12 might not be able to accurately reach the desired positions on the circuit board 13. Besides, when soldering the Light Emitting Diodes 12 to the circuit board 13, the plastic-made frames 11 might be deformed in a high temperature soldering machine.

The present invention intends to provide a vehicle light assembly that can accurately connect the Light Emitting Diodes between the holes of the frames and the circuit board.

SUMMARY OF THE INVENTION

The present invention relates to a vehicle light assembly which comprises a casing having a plurality of frames connected thereto and each frame has a hole defined therethrough. A plurality of Light Emitting Diodes each have a light bulb and two legs are connected to the light bulb. Two protrusions extend from the two legs respectively. A section from a distal end of each leg to the protrusion is soldered to at least one circuit board and the Light Emitting Diodes are then bent toward a side of the at least one circuit board. The light bulbs of the Light Emitting Diodes are inserted into the holes of the frames.

The primary object of the present invention is to provide a vehicle light assembly which can be easily and precisely cooperated with the frames at low cost.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
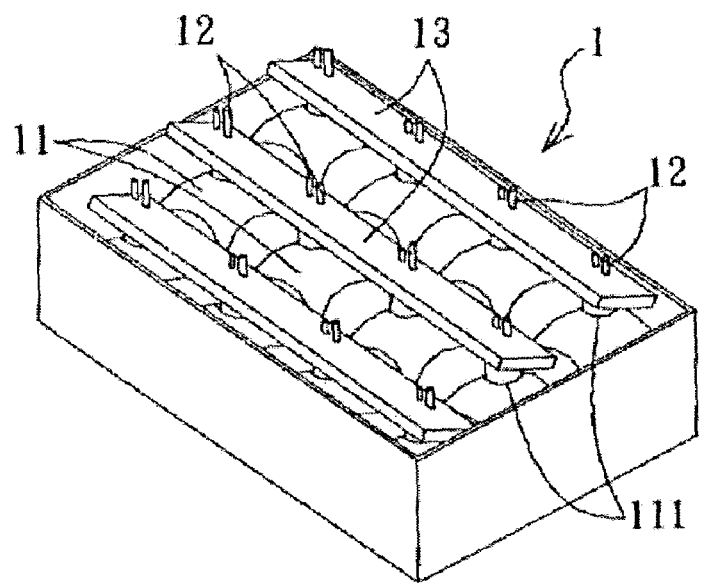
FIG. 1 is a perspective view to show the back of a conventional vehicle light assembly.
Figure 2:
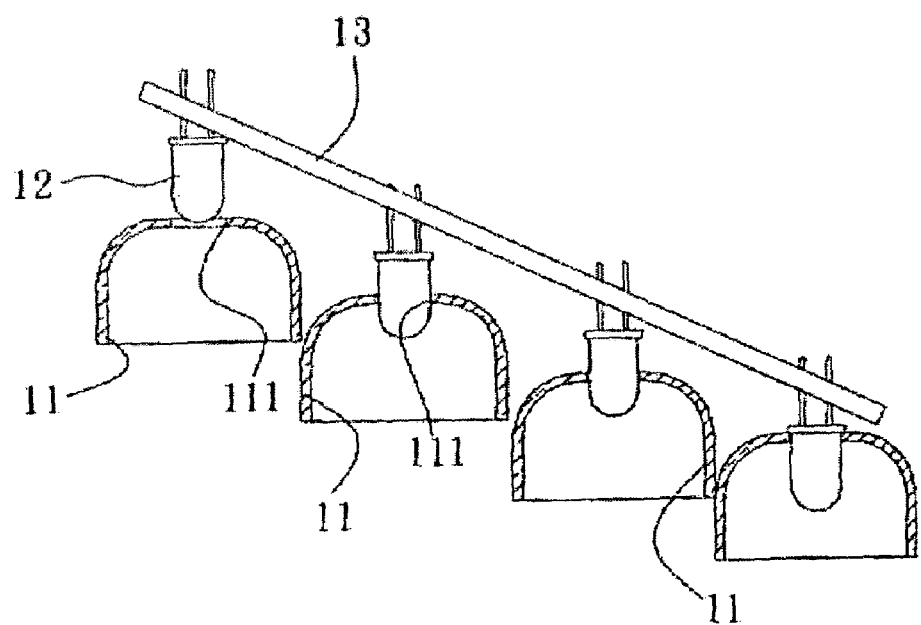
FIG. 2 shows a side cross sectional view of the conventional vehicle light assembly.
Figure 3:
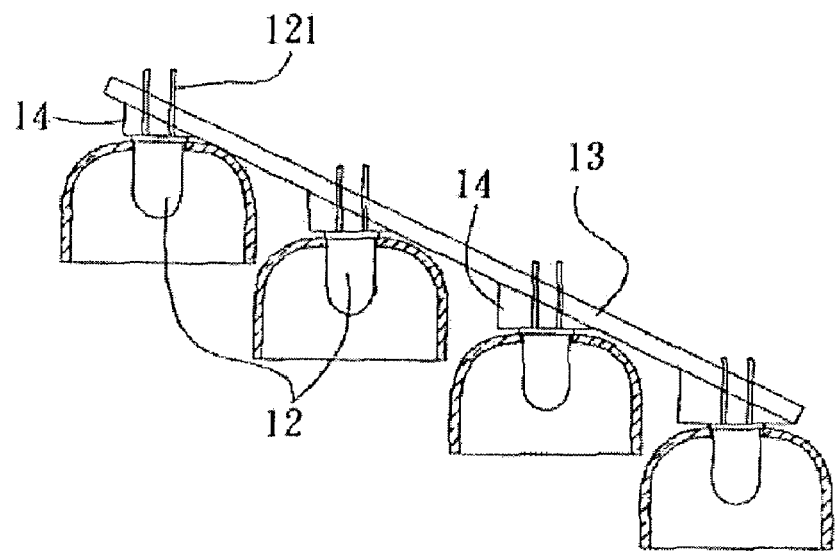
FIG. 3 is a side cross sectional view of another conventional vehicle light assembly wherein support members are used.
Figure 4:
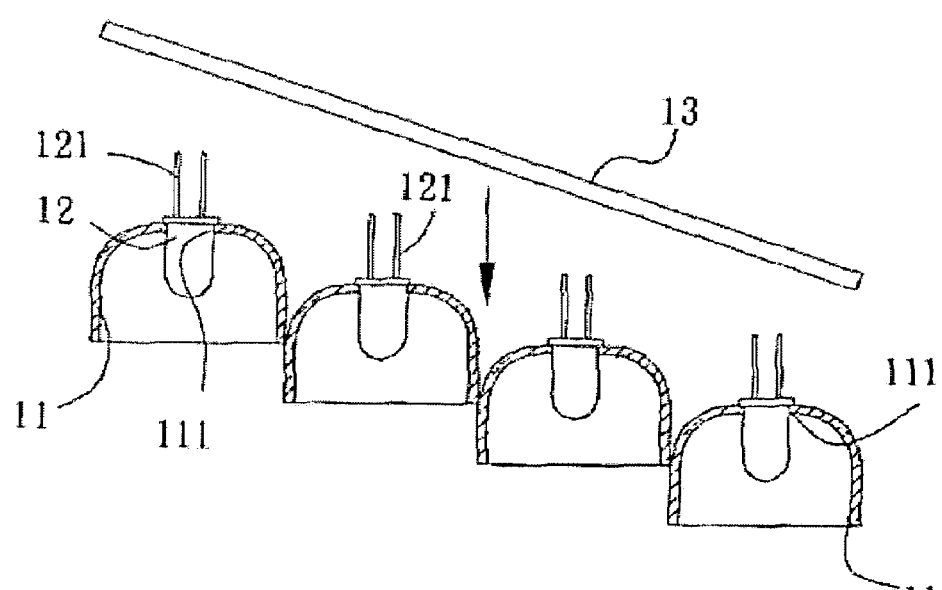
FIG. 4 is a side cross sectional view of yet another conventional vehicle light assembly.
Figure 5:
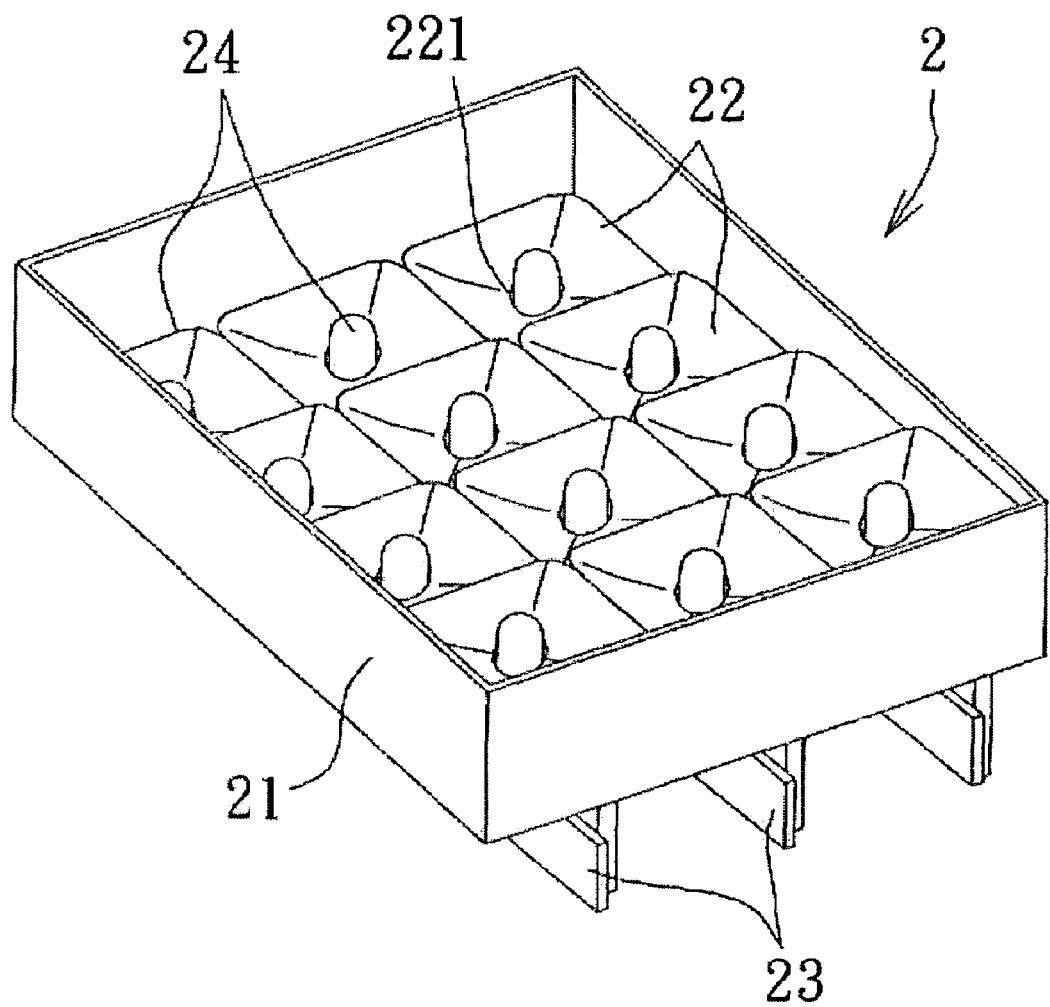
FIG. 5 is a perspective view to show the vehicle light assembly of the present invention.
Figure 6:
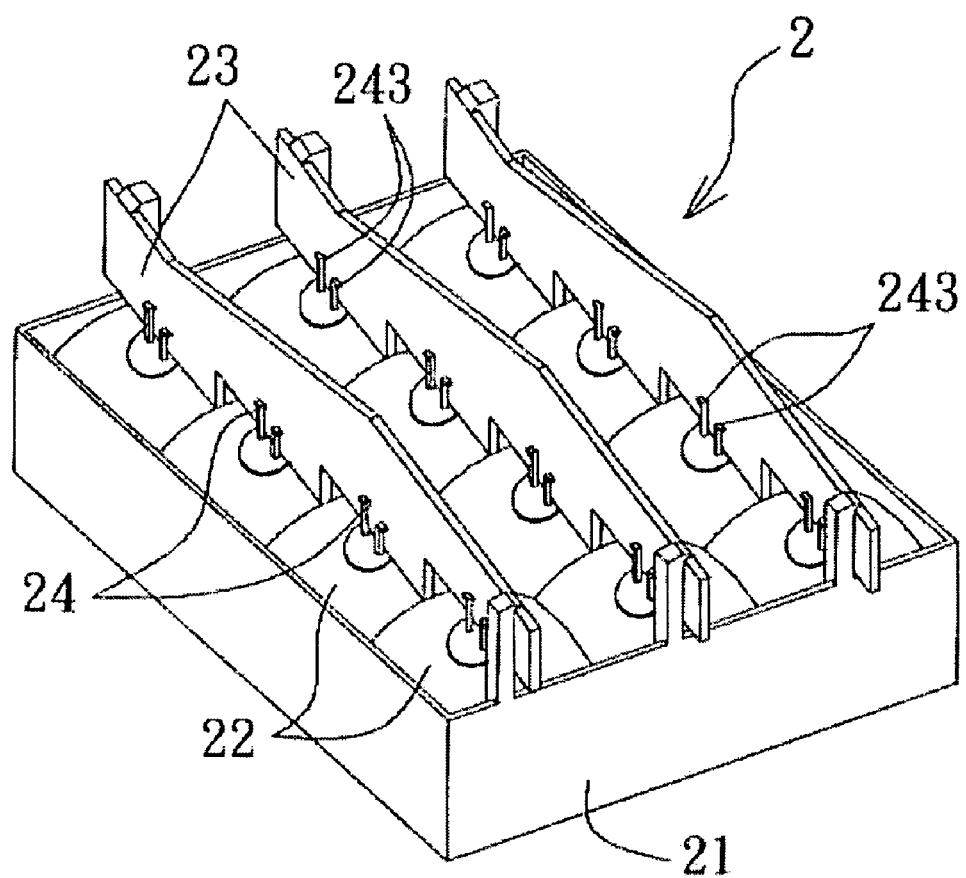
FIG. 6 is a perspective view to show the back of the vehicle light assembly of the present invention.

Referring to FIGS. 5 and 6, the vehicle light assembly 2 of the present invention comprises a rectangular casing 21 having four sidewalls and a plurality of frames 22 are connected to the casing 21. The frames 22 are not located on a flat plane and each frame 22 has a hole 221 defined therethrough. Each frame 22 is a bowl-shaped member and the hole 221 is located at a center of the frame 22.

Figure 7:
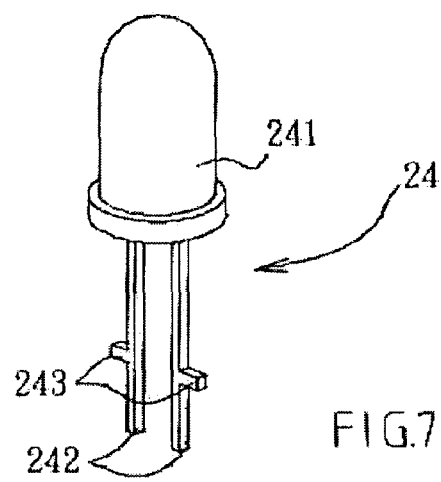
FIG. 7 shows a first embodiment of the Light Emitting Diode used in the vehicle light assembly of the present invention.
Figure 8:
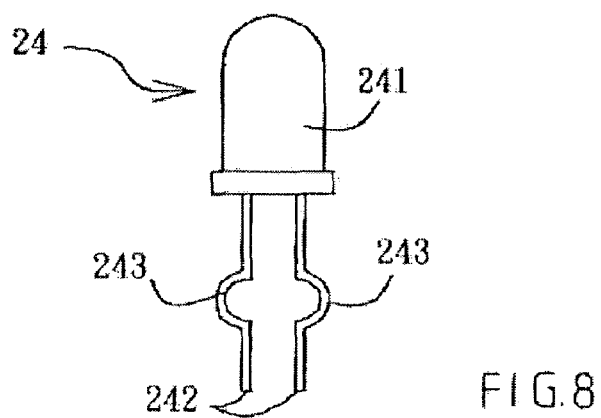
FIG. 8 shows a second embodiment of the Light Emitting Diode used in the vehicle light assembly of the present invention.
Figure 9:
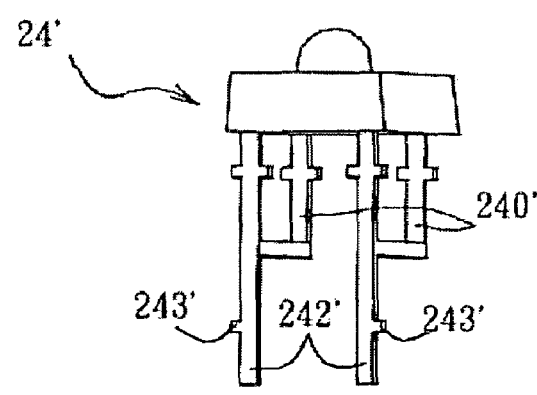
FIG. 9 shows a third embodiment of the Light Emitting Diode used in the vehicle light assembly of the present invention.
Figure 10:
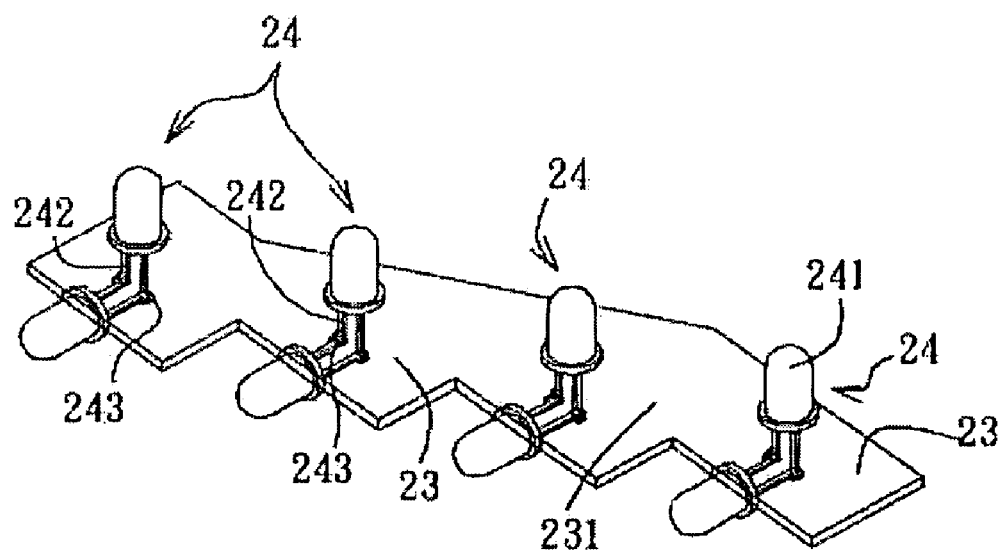
FIG. 10 shows that the Light Emitting Diodes are bent toward the side of the circuit board.
Figure 11:
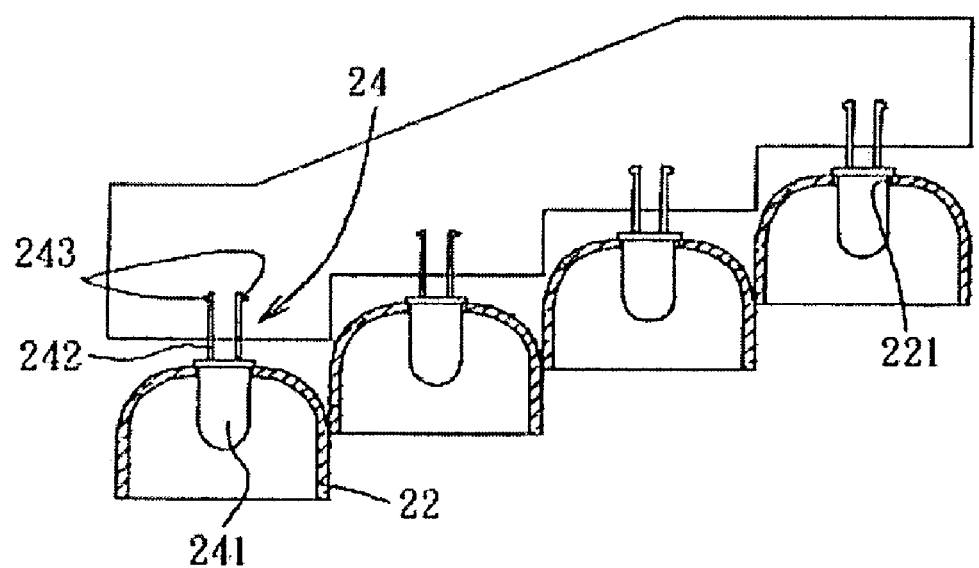
FIG. 11 shows that the light bulbs of the Light Emitting Diodes are inserted into the holes of the frame of the vehicle light assembly of the present invention.

A plurality of Light Emitting Diodes 24 each have a light bulb 241 and two legs 240 are connected to the light bulb 241. Two protrusions 243 extend laterally from the two legs 240 respectively. Each of the protrusions 243 is a short stud extending from of the leg 240 as shown in FIG. 7, or the protrusion 243 is a semi-circular protrusion as shown in FIG. 8. Some Light Emitting Diodes 24' have two first legs 240' and two second legs 242', the two first legs 240' are connected with the two second legs 242'. Each of the second legs 242' has a protrusion 243' extending therefrom.

The legs 240 of the Light Emitting Diodes 24 are connected to at least one circuit board 23. Each of the legs 240 is soldered to the at least one circuit board 23 by a section from a distal end of each leg 240 to the protrusion 243. The at least one circuit board 23 includes a side 231 which is shaped to include different stepped surfaces at different heights which are located correspondent to the frames 22. In this embodiment, the stepped surfaces are formed like stairs. The Light Emitting Diodes 24 are bent toward the side 231 and the light bulbs 241 project beyond the side 231 of the at least one circuit board 23. The light bulbs 241 are inserted into the holes 221 of the frames 22.

By the protrusions 243, 243', the distance that the legs 242, 242' are inserted into the at least one circuit board 23 can be controlled so that the distance that the light bulb 241 to the protrusions 243, 243' can also be controlled. By this arrangement, the light bulbs 241 can be inserted into the holes 221 of the frames 22 as desired.

While we have shown and described the embodiment in accordance with the present invention, it should be clear to those skilled in the art that further embodiments may be made without departing from the scope of the present invention.

What is claimed is:

1. A vehicle light assembly comprising:
    a casing having a plurality of frames connected thereto and each frame having a hole defined therethrough, the frames not located on a flat plane;
    a plurality of Light Emitting Diodes each having a light bulb and two legs connected to the light bulb, two protrusions extending from the two legs respectively, the light bulbs inserted into the holes of the frames, and
    at least one circuit board including a side and the legs of the Light Emitting Diodes connected to the at least one circuit board, each of the legs soldered to the at least one circuit board by a section from a distal end of each leg to the protrusion, the Light Emitting Diodes bent toward the side and the light bulbs projecting beyond the side of the at least one circuit board.

2. The assembly as claimed in claim 1, wherein the protrusions extend laterally from the legs.

3. The assembly as claimed in claim 1, wherein each of the protrusions is a short stud extending from of the leg.

4. The assembly as claimed in claim 1, wherein the protrusions each are a semi-circular protrusion.

5. The assembly as claimed in claim 1, wherein each frame is a bowl-shaped member and the hole is located at a center of the frame.

6. The assembly as claimed in claim 5, wherein the side of the at least one circuit board is shaped to include stepped surfaces of different heights which are located correspondent to the frames.

7. The assembly as claimed in claim 6, wherein the different heights of the at least one circuit board are shaped as stairs at different heights.

* * * * *